(12) United States Patent
Sugihara

(10) Patent No.: US 8,019,144 B2  
(45) Date of Patent: Sep. 13, 2011

(54) PATTERN IMAGE CORRECTING APPARATUS, PATTERN INSPECTION APPARATUS, AND PATTERN IMAGE CORRECTING METHOD

(75) Inventor: Shinji Sugihara, Tokyo (JP)

(73) Assignees: Kabushiki Kaisha Toshiba, Tokyo (JP); NEC Corporation, Tokyo (JP)

( * ) Notice: Subject to any disclaimer, the term of this patent is extended or adjusted under 35 U.S.C. 154(b) by 430 days.

(21) Appl. No.: 12/390,619

(22) Filed: Feb. 23, 2009

(65) Prior Publication Data

US 2009/0214104 A1  Aug. 27, 2009

(30) Foreign Application Priority Data

Feb. 25, 2008 (JP) ................................. 2008-042997

(51) Int. Cl.  
*G06K 9/00* (2006.01)

(52) U.S. Cl. ......... 382/141; 382/145; 382/144; 382/149

(58) Field of Classification Search .................. 382/141, 382/145, 147, 149, 152; 348/87, 126; 716/52, 716/112; 703/13  
See application file for complete search history.

(56) References Cited

U.S. PATENT DOCUMENTS

| | | | |
|---|---|---|---|
| 6,674,889 B1 * | 1/2004 | Takayama | 382/149 |
| 6,757,645 B2 * | 6/2004 | Chang et al. | 703/13 |
| 7,170,593 B2 * | 1/2007 | Honda et al. | 356/237.1 |
| 7,646,906 B2 * | 1/2010 | Saidin et al. | 382/144 |
| 7,769,225 B2 * | 8/2010 | Kekare et al. | 382/145 |
| 7,831,085 B2 * | 11/2010 | Hirano et al. | 382/144 |

FOREIGN PATENT DOCUMENTS

| | | |
|---|---|---|
| JP | 2000-241136 | 9/2000 |
| JP | 3965189 | 6/2007 |

* cited by examiner

*Primary Examiner* — Layla Lauchman  
(74) *Attorney, Agent, or Firm* — Oblon, Spivak, McClelland, Maier & Neustadt, L.L.P.

(57) ABSTRACT

The present invention provides an apparatus and method for correcting an inspection reference pattern image in order to properly inspect a pattern image of a specimen. The pattern image correcting apparatus is characterized by including: a first pattern synthesizing unit for synthesizing an assist pattern image and a pattern image to be inspected, thereby generating a pattern image to be inspected with an assist pattern; an assist pattern shift processor; a second pattern synthesizing unit for synthesizing the shifted assist pattern image and the inspection reference pattern image, thereby generating an inspection reference pattern image with an assist pattern; a model generating unit for generating a position shift model by using the pattern image to be inspected with the assist pattern and the inspection reference pattern image with the assist pattern; and a correction pattern image computing unit for correcting the inspection reference pattern image.

10 Claims, 9 Drawing Sheets

PATTERN IMAGE CORRECTING APPARATUS, PATTERN INSPECTION APPARATUS, AND PATTERN IMAGE CORRECTING METHOD

CROSS-REFERENCE TO RELATED APPLICATION

This application is based upon and claims the benefit of priority from Japanese Patent Application No. 2008-042997, filed on Feb. 25, 2008, the entire contents of which are incorporated herein by reference.

FIELD OF THE INVENTION

The present invention relates to a pattern image correcting apparatus, a pattern inspection apparatus, and a pattern image correcting method. For example, the invention relates to a pattern image correcting apparatus, a pattern inspection apparatus, and a pattern image correcting method applied to an inspection for a defect in a mask for semiconductor lithography.

BACKGROUND OF THE INVENTION

In recent years, as a large scale integrated circuit (LSI) is having higher integration and larger capacity, circuit line width required for semiconductor devices is becoming smaller and smaller. The semiconductor devices are manufactured by forming circuits by exposing and transferring a pattern on a wafer by a reduced projection exposure apparatus which is a so-called stepper using an original image pattern (also called a mask or a reticle, hereinbelow, generically called a mask) in which a circuit pattern is formed.

For manufacture of an LSI whose cost is extremely high, it is essential to improve die yield. One of main factors of deteriorating the yield is a pattern defect in a mask used at the time of exposing and transferring an ultrafine pattern onto a semiconductor wafer. In recent years, as the dimensions of an LSI pattern formed on a semiconductor wafer are becoming smaller, the dimensions of a pattern defect to be detected are also becoming extremely small. Consequently, it requires higher precision of a pattern inspection apparatus for inspecting a defect in a mask used for LSI manufacture.

The pattern defect inspecting method is largely divided into a die to die (DD) comparison inspection and a die to database (DB) comparison inspection. The DD comparison inspection is a method of detecting a defect by comparing measurement data of two dies on a mask (an inspection reference pattern image and a pattern image to be inspected). The DB comparison inspection is a method of detecting a defect by comparing measurement data of a die (data of a pattern image to be inspected) and design data of the die generated from CAD data for LSI designing (data of the inspection reference pattern image).

In the DB comparison inspection, a specimen is placed on a stage of a pattern inspection apparatus and is scanned with a light flux when the stage is moved, and an inspection is performed. The specimen is irradiated with the light flux from a light source and an illumination optical system. An image is formed on a sensor by light passed through the specimen or reflected from the specimen via the optical system. The image picked up by the sensor is transmitted as measurement data to a comparison circuit. In the comparison circuit, after positioning of the images, measurement data and design data is compared with each other by using a proper algorithm. When the data do not match, presence of a pattern defect is determined.

In recent years, as a pattern on a mask for lithography is becoming smaller, it becomes necessary to detect a small defect which is hidden by a positional deviation between images to be compared, expansion and contraction of the images, a wave in the image, sensing noise, and the like. Consequently, the inspection reference pattern image and the pattern image to be inspected have to be positioned with high precision. Further, to detect these defects, image correction is important. Therefore, prior to comparison inspection, the inspection reference pattern image and the pattern image to be inspected are aligned. After that, image corrections are performed in order such as correction of expansion and contraction of the images (for example, JP-A No. 2000-241136 (KOKAI), correction of a wave in an image, resize correction, noise averaging process, and the like.

However, when such corrections are repeated, an accumulated error is caused, and it causes deterioration in an image. Further, when the inspection reference pattern image and the pattern image to be inspected become excessively closer to each other due to excessive corrections, it becomes difficult to detect a defect. That is, the excessive corrections produce the opposite effect.

JP 3965189 discloses image correction using an input/output prediction model as effective image correction with little image deterioration by unifying an alignment for final fine adjustment from a sub-pixel level and image correction. In the image correction, for example, alignment on the sub-pixel unit basis and image correction are simultaneously realized by using an inspection reference pattern image as input data and using a pattern image to be inspected as output data. In this case, a relational expression of a matrix is generated from image data. By solving simultaneous equations, a model parameter (coefficient) is identified. On the basis of a two-dimensional linear prediction model to which the identified model parameter is applied, the inspection reference pattern image is corrected, thereby generating a corrected pattern image.

SUMMARY OF THE INVENTION

An embodiment of the present invention relates to a pattern image correcting apparatus for correcting an inspection reference pattern image in a pattern inspection, including: a first pattern synthesizing unit for synthesizing an assist pattern image and a pattern image to be inspected, thereby generating a pattern image to be inspected with an assist pattern; an assist pattern shift processing unit for shifting the assist pattern image on the basis of a relative positional deviation amount of the inspection reference pattern image and the pattern image to be inspected; a second pattern synthesizing unit for synthesizing the shifted assist pattern image and the inspection reference pattern image, thereby generating an inspection reference pattern image with an assist pattern; a model generating unit for generating a position shift model by using the pattern image to be inspected with the assist pattern and the inspection reference pattern image with the assist pattern; and a correction pattern image computing unit for correcting the inspection reference pattern image on the basis of the position shift model.

Another embodiment of the present invention relates to a pattern image correcting method of correcting an inspection reference pattern image in a pattern inspection, including: a first pattern synthesizing step of synthesizing an assist pattern image and a pattern image to be inspected, thereby generating a pattern image to be inspected with an assist pattern; an assist pattern shift processing step of shifting the assist pattern image on the basis of a relative positional deviation amount between the inspection reference pattern image and the pattern image to be inspected; a second pattern synthesizing step of synthesizing the shifted assist pattern image and the inspection reference pattern image, thereby generating an inspection reference pattern image with an assist pattern; a model generating step of generating a position shift model by using the pattern image to be inspected with the assist pattern and the inspection reference pattern image with the assist pattern; and a correction pattern image computing step of correcting the inspection reference pattern image on the basis of the position shift model.

According to the present invention, the apparatus and method for correcting an image of an inspection reference pattern to properly inspect specimen can be provided.

DETAILED DESCRIPTION OF THE EMBODIMENTS

Also in the pattern image correcting method in JP 3965189 described above as an example, when an image having biased pattern edge information such as line and space pattern or a plain pattern is input, there is a case that a proper model parameter is not generated due to insufficient input information. For example, when there is a pattern defect in pattern images to be inspected, the weight of correction on the defect can increases excessively, and there is the possibility that an inspection reference pattern image is excessively corrected. Such excessive correction on the inspection reference pattern image causes degradation in accuracy of inspection.

In the following embodiments, at the time of correcting an image in a pattern inspection apparatus such as a mask inspection apparatus for lithography, an assist pattern image is combined to each of a pattern image to be inspected and an inspection reference pattern image. Combinations of the assist pattern image compensate insufficient input information, thereby obtaining a proper model parameter. By this image correction, an inspection reference pattern can be properly corrected. An effective image correcting method adapted to various pattern images will be described hereinbelow.

First Embodiment

Figure 2:
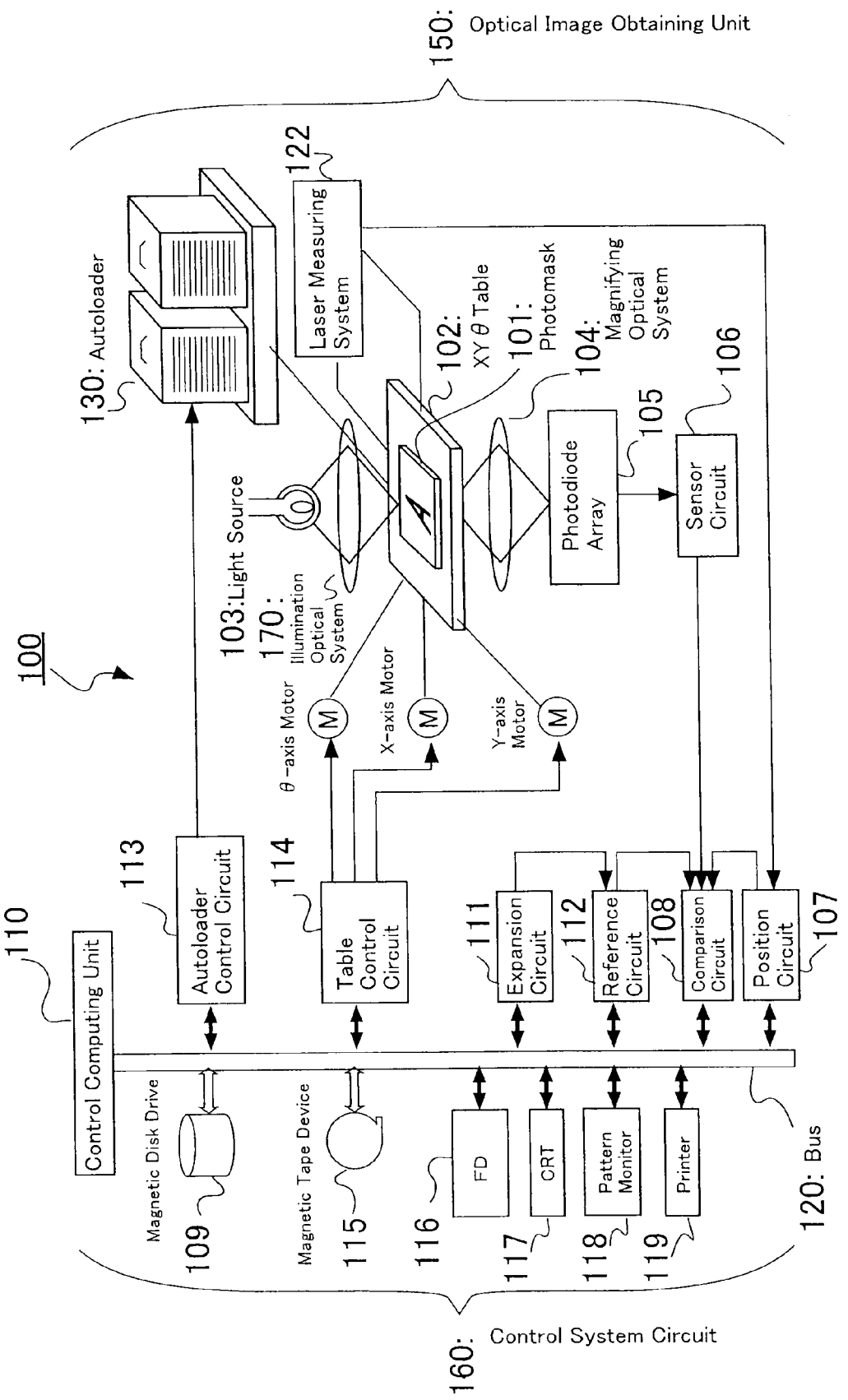
FIG. 2 is a block diagram of a pattern inspection apparatus of the first embodiment.

FIG. 2 is a block diagram showing the configuration of a pattern inspection apparatus of the first embodiment. In the pattern inspection apparatus of FIG. 2, a substrate such as an mask or a wafer on which a pattern is formed is used as a specimen. A pattern inspection apparatus 100 for inspecting a defect in a specimen has an optical image obtaining unit 150 and a control system circuit 160. The optical image obtaining unit 150 has an XYθ table 102, a light source 103, a magnifying optical system 104, a photodiode array 105, a sensor circuit 106, a laser measuring system 122, an auto loader 130, and an illumination optical system 170. In the control system circuit 160, a control computing unit 110 as a computer is connected to a position circuit 107, a comparison circuit 108, an expansion circuit 111, a reference circuit 112, an auto loader control circuit 113, a table control circuit 114, a magnetic disk drive 109, a magnetic tape apparatus 115, a flexible disk drive (FD) 116, a CRT 117, a pattern monitor 118, and a printer 119 via a bus 120 as a data transmission path. The XYθ table 102 is driven by an X-axis motor, a Y-axis motor, and a θ-axis motor.

In FIG. 2, components other than the components necessary for explaining the embodiment are not shown. Obviously, the pattern inspection apparatus 100 includes the other components which are usually necessary.

Figure 1:
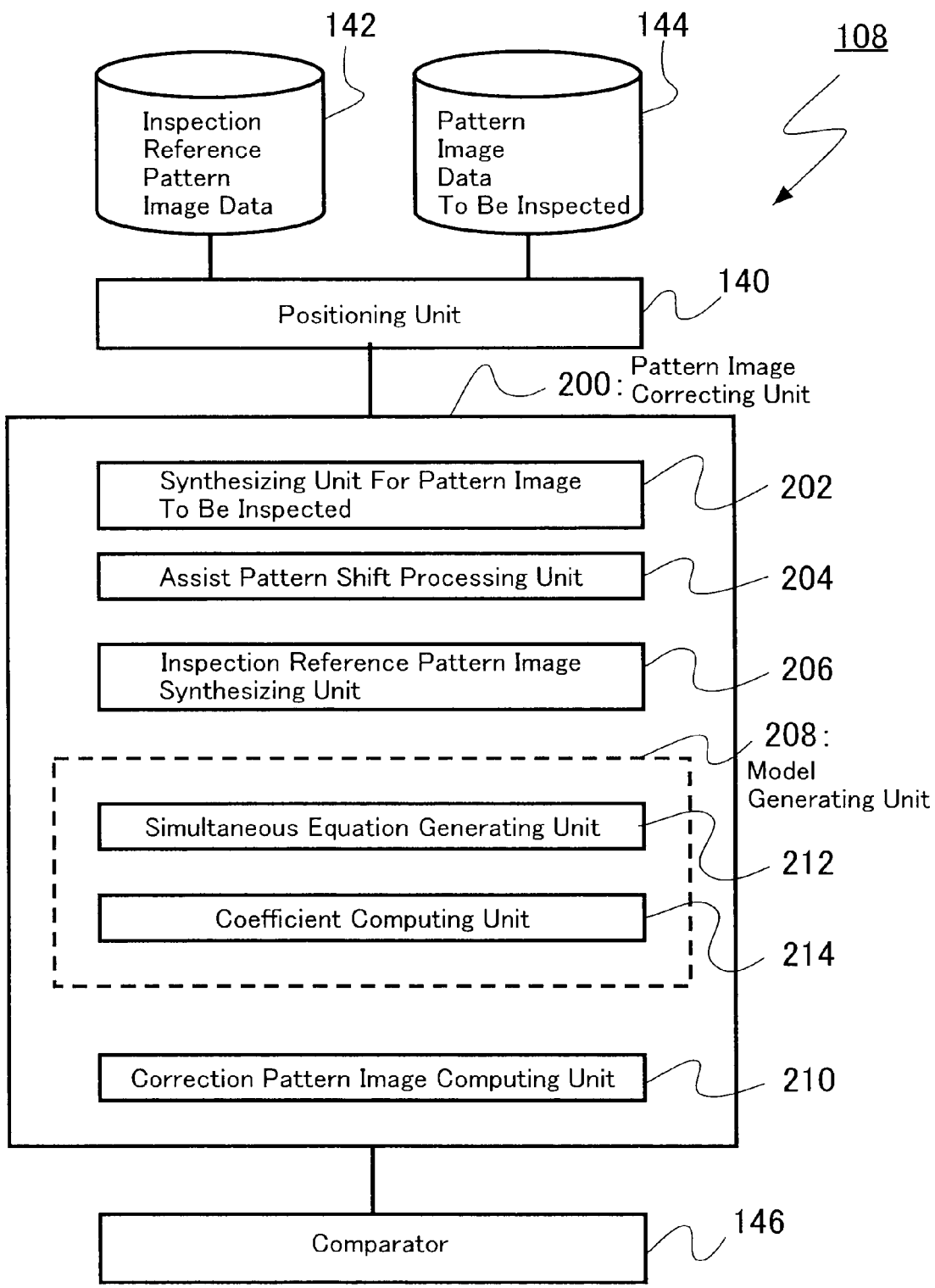
FIG. 1 is a block diagram showing an internal configuration of a comparison circuit of a first embodiment.

FIG. 1 is a block diagram showing an internal configuration of the comparison circuit in FIG. 2. In FIG. 1, the comparison circuit 108 has memories 142 and 144, a positioning unit 140, a pattern image correcting unit 200, and a comparator 146.

In the memory 142, reference data (inspection reference pattern image data) input from the reference circuit 112 is stored. In the memory 144, measurement data (pattern image data to be inspected) input from the sensor circuit 106 is stored. The pattern image correcting unit 200 is an example of a pattern image correcting apparatus.

The pattern image correcting unit 200 has a synthesizing unit 202 for a pattern image to be inspected (first pattern synthesizing unit), an assist pattern shift processing unit 204, an inspection reference pattern image synthesizing unit (second pattern synthesizing unit) 206, a model generating unit 208, and a correction pattern image computing unit 210. Further, the model generating unit 208 has a simultaneous equation generating unit 212 and a coefficient (parameter) computing unit 214.

In FIG. 1, components other than the components necessary for explaining the embodiment are not shown. The comparison circuit 108 or the pattern image correcting unit 200 may include other components. The functions of the positioning unit 140, the pattern image correcting unit 200, and the comparator 146 may be realized by, for example, computer-executable software. However, the functions are not limited to the software. For example, they may be realized by hardware such as electric circuits. They may be realized by a combination of hardware such as electric circuits and software, or a combination of the hardware and firmware. Similarly, the functions of the synthesizing unit 202 for a pattern image to be inspected, the assist pattern shift processing unit 204, the inspection reference pattern image synthesizing unit 206, model generating unit 208, simultaneous equation generating unit 212, coefficient (parameter) computing unit 214, and correction pattern image computing unit 210 may be realized by, for example, computer-executable software. They maybe realized by hardware such as electric circuits. They maybe realized by a combination of hardware such as electric circuits and software, or a combination of the hardware and firmware.

The operation of the pattern inspection apparatus 100 will be described below with reference to FIG. 2. First, as an optical image obtaining process, the optical image obtaining unit 150 obtains an optical image of a mask 101 as a specimen in which a pattern is formed on the basis of design data. Specifically, the optical image is obtained as follows.

The mask 101 as a specimen to be inspected is placed on the XYθ table 102 that moves in the horizontal direction and the rotating direction by motors on the X, Y, and θ axes. The pattern formed in the mask 101 is irradiated with light from the light source 103 disposed above the XYθ table 102. The light flux emitted from the light source 103 falls on the mask 101 via the illumination optical system 170. Below the mask 101, the magnifying optical system 104, the photodiode array 105, and the sensor circuit 106 are disposed. Light passed through the mask 101 forms an optical image on the photodiode array 105 via the magnifying optical system 104. The focus of the magnifying optical system 104 may be automatically adjusted by a not-shown automatic focusing mechanism.

Figure 3:
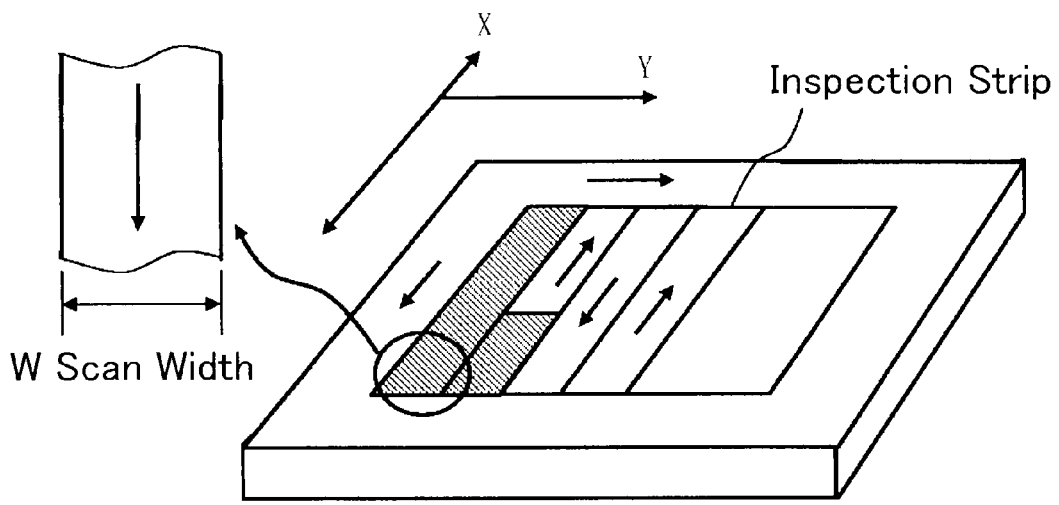
FIG. 3 is a diagram for explaining a procedure of obtaining an optical image of the first embodiment.

FIG. 3 is a diagram for explaining the optical image obtaining procedure. As shown in FIG. 3, a region to be inspected is virtually divided into a plurality of inspection strips each having a scan width W in the Y direction. Further, the operation of the XYθ table 102 is controlled so that the divided inspection strips are continuously scanned, and optical images are obtained with shifting in the X direction.

The photodiode array 105 (FIG. 2) continuously receives images each having the scan width W as shown in FIG. 3. After obtaining an image in a first inspection strip, similarly, the photodiode array 105 continuously receives an image in a second inspection strip having the scan width W in the opposite direction. In the case of obtaining an image in a third inspection strip, an image is obtained in the direction opposite to the direction of obtaining the image in the second inspection strip, that is, in the direction of obtaining the image in the first inspection strip. By continuously obtaining images, waste process time can be shortened.

The optical image of the pattern formed on the photodiode array 105 is acquired by the photodiode array 105 and the analog-to-digital conversion is carried out by the sensor circuit 106. For the photodiode array 105, for example, a TDI (time delay integrator) sensor is used. By continuously moving the XYθ table in the X-axis direction, the TDI sensor picks up an image of a pattern of the mask 101. By the light source 103, the magnifying optical system 104, the photodiode array 105, and the sensor circuit 106, a high-power inspection optical system is constructed.

The XYθ table 102 is driven by the table control circuit 114 under control of the control computing unit 110 and can be moved by a drive system such as a triaxial (X-Y-θ) motor for driving in the X direction, the Y direction, and the θ direction. As the X-axis motor, the Y-axis motor, and the θ-axis motor, for example, step motors can be used. A position of the XYθ table 102 is measured by the laser measuring system 122 and supplied to the position circuit 107. The mask 101 on the XYθ table 102 is automatically loaded by the auto loader 130 driven by the autoloader control circuit 113 and, after completion of the inspection, automatically unloaded.

Measurement data (inspected pattern image data: optical image) output from the sensor circuit 106 is transmitted together with position data output from the position circuit 107 to the comparison circuit 108. The measurement data is, for example, 8-bit unsigned data and expresses the tone of brightness of each pixel. The measurement data is compared, for example, in every image data of 512 pixels×512 pixels.

On the other hand, design data of the mask 101 is stored in the magnetic disk drive 109. As the design data input process, the design data is loaded from the magnetic disk drive 109 to the expansion circuit 111 via the control computing unit 110. As the expanding process, the expansion circuit 111 converts design figure data of the mask 101 to binary or multi-value image data, and the image data is transmitted to the reference circuit 112.

In the embodiment, the basic figure of the design data is rectangle or triangle. For example, the design data has figure data defining the shape, size, position, and the like of each of pattern figures by information such as a coordinate (x,y) in the two vertex positions and a figure code as an identifier for discriminating the kind of the figure such as rectangle or triangle. When the design data is input to the expansion circuit 111, the design data is expanded to data of a figure. The expansion circuit 111 interprets a figure code, figure dimensions, and the like indicating the figure shape of the figure data. The expansion circuit 111 expands the data to figure pattern data of two values or multiple values as a pattern disposed in a grid.

In other words, design data is read, occupancy of the figure in the design data is computed for every grid obtained by virtually dividing the inspection area, and occupancy data is generated and output to an internal pattern memory. For example, it is preferable to set one grid as one sensor pixel. The image data of the design data may be generated as 8-bit occupancy data and stored in an internal pattern memory.

The reference circuit 112 generates reference data (inspection reference pattern image data) to be compared with measurement data from the image data of the figure sent from the expansion circuit 111. The reference data is generated as image data of, for example, 512 pixels×512 pixels like the measurement data.

Although the reference data is generated on the basis of the design data for performing the "die to database inspection", the invention is not limited to the inspection. The "die to die inspection" can be also performed. In this case, it is sufficient to generate reference data on the basis of another measurement data (optical image) to be compared. The reference data is sent to the comparison circuit 108.

The comparison circuit 108 receives the reference data and the measurement data. The reference data (inspection reference pattern image data) is stored in the memory 142 shown in FIG. 1. The measurement data (inspected pattern image data) is stored in the memory 144. The positioning unit 140 corrects a pixel positional deviation by shifting the data on the pixel unit basis. That is, the positional deviation between the images is corrected to be less than one pixel. It may be sufficient to preliminarily adjust the image in a position where an evaluation function expressed by the sum of squares of the tone value difference of pixels corresponding to the images is minimized. Furthermore, the positional deviation on the sub-pixel unit basis is similarly obtained. After that, the reference data (inspection reference pattern image data) is corrected to generate a corrected pattern image. The corrected pattern image data and the measurement data are compared according to a predetermined algorithm to detect a defect.

Figure 4:
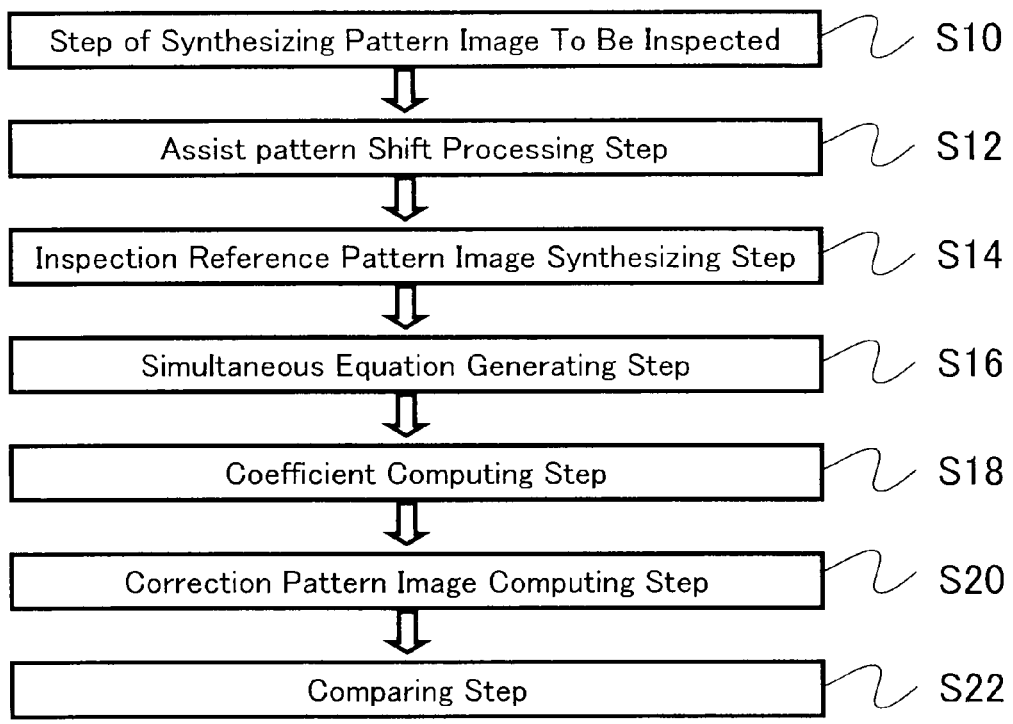
FIG. 4 is a flowchart showing main processes of a pattern image correcting method in the first embodiment.

FIG. 4 is a flowchart showing main processes in the pattern image correcting method in the embodiment. In FIG. 4, the pattern image correcting method executes a series of processes such as a step S10 of synthesizing a pattern image to be inspected (first pattern synthesizing step), an assist pattern shift processing step S12, an inspection reference image synthesizing step (second pattern synthesizing step) S14, a simultaneous equation generating step S16, a coefficient (parameter) computing step S18, and a correction pattern image computing step S20. In the inspection method, a comparing step S22 of comparing the correction pattern image with the pattern image to be inspected is executed.

Figure 5A:
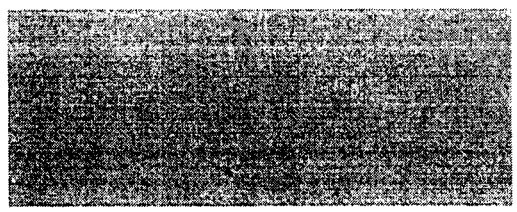
FIGS. 5A to 5C are diagrams showing an example of an image synthesized by an image synthesizing unit in the first embodiment.
Figure 5B:
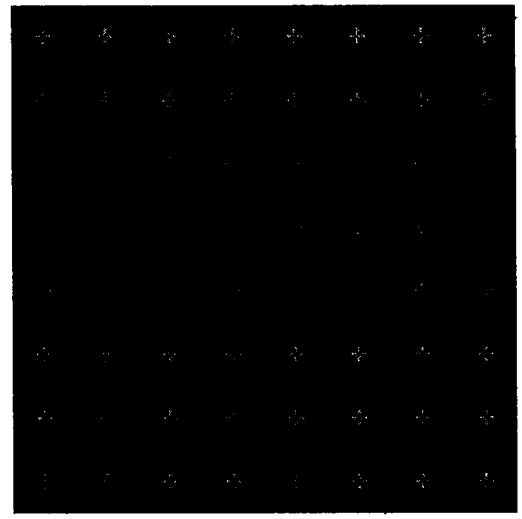
Figure 5C:
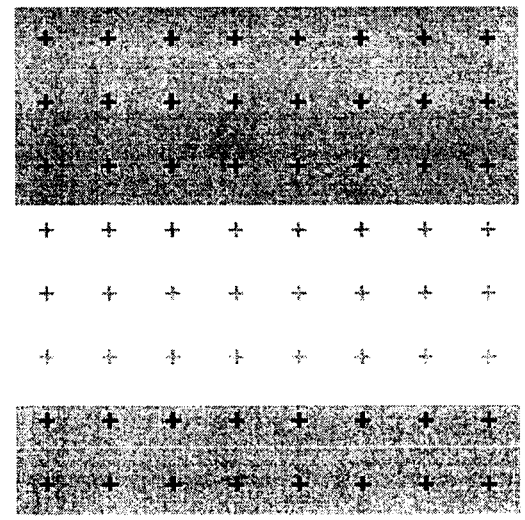

In the step S10 of synthesizing a pattern image to be inspected, the synthesizing unit 202 for a pattern image to be inspected (FIG. 1) synthesizes a pattern image to be inspected and an assist pattern image to generate a pattern image to be inspected with an assist pattern. FIG. 5A shows a pattern image to be inspected, and FIG. 5B shows an example of an assist pattern image. FIG. 5C shows a pattern image to be inspected with an assist pattern obtained by synthesizing the pattern image to be inspected and the assist pattern image.

In the embodiment, as synthesis of images, the value of each of pixels of the assist pattern image is subtracted from the value of each of pixels of the pattern image to be inspected. The synthesis of images is not limited to subtraction but may be addition, multiplication, selection of a larger (smaller) value from the values, a combination of the processes, or the like. The computing methods may be selected on the basis of the pattern information of the pattern image to be inspected.

In the assist pattern image shift computing step S12, the assist pattern image shift computing unit 204 (FIG. 1) computes a shift image of an assist pattern image on the basis of the relative positional deviation between the pattern image to be inspected and the inspection reference pattern image. The case of computing a shift image by bi-cubic interpolation will be described. Assume the shift amount "l" in the x direction and the shift amount "m" in the y direction in the sub-pixel unit are obtained in advance. An image u" obtained by shifting an image u by (l, m) can be obtained by the following equations (1-1) and (1-2). The shift amount can be obtained by, for example, a method of varying the shift amount in a predetermined range and obtaining the shift amount at which the square sum of the tone value difference between the pattern image to be inspected and the inspection reference pattern image after the shift becomes the minimum.

$$u'_{i,j} = \sum_{k=0}^{4} p_k u_{i,j+k-2} \quad (1\text{-}1)$$

$$u''_{i,j} = \sum_{k=0}^{4} q_k u'_{i+k-2,j} \quad (1\text{-}2)$$

wherein p and q are given by the following equations.

$$p_0 = 0$$

$$p_1 = -\frac{1}{2}l(l-1)^2$$

$$p_2 = \frac{1}{2}(l-1)(3l^2 - 2l - 2)$$

$$p_3 = \frac{1}{2}l(1 + 4l - 3l^2)$$

$$p_4 = \frac{1}{2}l^2(l-1)$$

$$q_0 = 0$$

$$q_1 = -\frac{1}{2}m(m-1)^2$$

$$q_2 = \frac{1}{2}(m-1)(3m^2 - 2m - 2)$$

$$q_3 = \frac{1}{2}m(1 + 4m - 3m^2)$$

$$q_4 = \frac{1}{2}m^2(m-1)$$

The image shift computation is not limited to the bi-cubic interpolation but may be linear interpolation, spline interpolation, or the like.

In the inspection reference pattern image synthesizing step S14, the inspection reference pattern image synthesizing unit 206 (FIG. 1) synthesizes the inspection reference pattern image and the assist pattern image obtained by performing the shift process in the assist pattern shift processing step S12, thereby generating the inspection reference pattern image with the assist pattern. In this step, a synthesizing method similar to that in the step S10 of synthesizing a pattern image to be inspected is used.

By the assist pattern synthesis in the steps S10 and S14, further information is added to the entire image. By estimation of a model parameter (coefficient) using a two-dimensional prediction model which will be described later, generation of a peculiar solution can be suppressed. Although a cross pattern is used as an assist pattern image in the embodiment, a box pattern, a hole pattern, or the like can be properly used. To estimate a model parameter favorably, it is preferable to use an assist pattern image having an image profile equivalent to that of an optical image obtained by the image obtaining unit.

In the simultaneous equation generating step S16, the simultaneous equation generating unit 212 (FIG. 1) generates simultaneous equations based on the following two-dimensional input/output linear prediction model using data of the pattern image to be inspected with the assist pattern and data of the corresponding inspection reference pattern image with the assist pattern. First, a method of setting a two-dimensional input/output linear prediction model by regarding data of the inspection reference pattern image with the assist pattern as two-dimensional input data "u" and regarding the data of the pattern image to be inspected with the assist pattern as two-dimensional output data "y" will be described.

Figure 6:
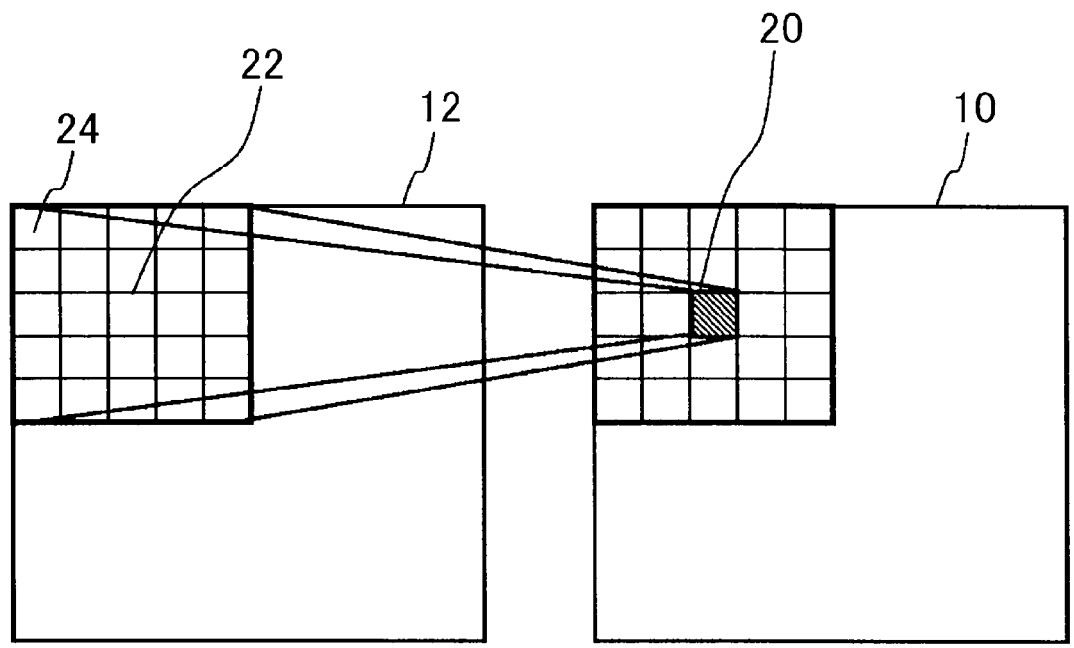
FIG. 6 is a diagram for explaining a two-dimensional input/output linear prediction model of the first embodiment.

FIG. 6 is a diagram for explaining the two-dimensional input/output linear prediction model in the embodiment. A two-dimensional linear prediction model of the 5×5th order using a region of 5×5 pixels will be taken as an example. Table 1 shows suffixes used in this model.

TABLE 1

| | | | | |
|---|---|---|---|---|
| i − 2, j − 2 | i − 2, j − 1 | i − 2, j | i − 2, j + 1 | i − 2, j + 2 |
| i − 1, j − 2 | i − 1, j − 1 | i − 1, j | i − 1, j + 1 | i − 1, j + 2 |
| i, j − 2 | i, j − 1 | i, j | i, j + 1 | i, j + 2 |
| i + 1, j − 2 | i + 1, j − 1 | i + 1, j | i + 1, j + 1 | i + 1, j + 2 |
| i + 2, j + 2 | i + 2, j − 1 | i + 2, j | i + 2, j + 1 | i + 2, j + 2 |

Using the suffixes as shown in Table 1, two-dimensional input data (tone value) is expressed as u(i, j) and two-dimensional output data (tone value) is expressed as y(i, j). The suffixes (coordinates) of a target pixel 20 in a pattern image 10 to be inspected with an assist pattern in FIG. 6 are expressed as i, j. The suffixes of total 25 pixels in an inspection reference pattern image 12 with an assist pattern are also set as shown in Table 1. These 25 pixels made of a pixel 22 and pixels 24 in two preceding rows and two subsequent rows and in two preceding columns and two subsequent columns surrounding the pixel 22. The following relational equation (3) is set for pixel data in a certain 5×5 region.

$$y_k = y(i,j) = b_{00}u(i-2, j-2) + b_{01}u(i-2, j-1) + b_{02}u(i-2, j) + \quad (3)$$
$$+ b_{03}u(i-2, j+1) + b_{04}u(i-2, j+2) + b_{10}u(i-1, j-2) +$$
$$+ b_{11}u(i-1, j-1) + b_{12}u(i-1, j) + b_{13}u(i-1, j+1) +$$
$$+ b_{14}u(i-1, j+2) + b_{20}u(i, j-2) + b_{21}u(i, j-1) + b_{22}u(i, j) +$$
$$+ b_{23}u(i, j+1) + b_{24}u(i, j+2) + b_{30}u(i+1, j-2) +$$
$$+ b_{31}u(i+1, j-1) + b_{32}u(i+1, j) + b_{33}u(i+1, j+1) +$$
$$+ b_{34}u(i+1, j+2) + b_{40}u(i+2, j-2) + b_{41}u(i+2, j-1) +$$
$$+ b_{42}u(i+2, j) + b_{43}u(i+2, j+1) + b_{44}u(i+2, j+2) + \varepsilon(i,j)$$

The data $u(i,j)$ of the inspection reference pattern image with the assist pattern in each of coordinates in the relational equation (3) is multiplied by $b_{00}$ to $b_{44}$. Here, $b_{00}$ to $b_{44}$ are model parameters (coefficients) to be identified. The equation (3) means that data $y_k=y(i,j)$ of a certain pixel 20 in the pattern image 10 to be inspected with the assist pattern can be expressed by linear combination of the data of 5×5 pixels made of the pixel 22 in the corresponding inspection reference pattern image 12 with the assist pattern and the pixels 24 surrounding the pixel 22. By performing convolution operation using a linear prediction model, wave or noise in an image can be removed. When the equation (1) is expressed in a vector form (matrix form), it can be expressed as equations (4-1) to (4-3).

$$\alpha = [b_{00}, b_{01}, \ldots, b_{44}]^T \quad (4\text{-}1)$$

$$X_k = [u(i-2, j-2), u(i-2, j-1), \ldots, u(i+2, j+2)]^T \quad (4\text{-}2)$$

$$X_k^T \cdot \alpha = y_k \quad (4\text{-}3)$$

When the coordinates $(i, j)$ of the inspection reference pattern image with the assist pattern and the pattern image to be inspected with the assist pattern are scanned to make 25 sets of the equations (4-3) and solve these simultaneous equations, model parameters (coefficients) can be identified.

From the statistical viewpoint, it is also suitable to prepare "n" (>25) sets of data like in the following equation (5-1), solve simultaneous equations of 25 dimensions on the basis of the method of least squares (5-2), and determine $\alpha$. As a solution of such an equation, except for the method of least squares, there are the maximum likelihood estimation method, and the like. Any of the methods can be used.

$$\begin{bmatrix} X_1^T \\ \vdots \\ X_n^T \end{bmatrix} \cdot \alpha = \begin{bmatrix} y_1 \\ \vdots \\ y_n \end{bmatrix} \quad (5\text{-}1)$$

$$(A^T \cdot A)\alpha = A^T \cdot y \quad (5\text{-}2)$$

wherein $A=[x_1, x_2, \ldots, x_n]^T$, $y=[y_1, y_2, \ldots, y_n]^T$, and $k=1, 2, \ldots n$. For example, when each of the inspection reference pattern image 12 with the assist pattern and the pattern image 10 to be inspected with the assist pattern is made of 512×512 pixels, the peripheral two pixels cannot be modeled. Consequently, by scanning a (5×5)th model (4-3), the periphery of the image is decreased by two pixels each. As a result, data of n=(512−4)×(512−4)=258,064 sets is obtained, so that the number of data pieces sufficient from the statistical viewpoint can be obtained. The simultaneous equation generating unit 212 generates the simultaneous equations (5-1) and (5-2) from the inspection reference pattern image with the assist pattern and the pattern image to be inspected with the assist pattern, that is, a matrix ($A^TA$) of 25×25 elements and a vector $A^Ty$ of 25 elements.

In the coefficient (parameter) computing step S18, the coefficient (parameter) computing unit 214 (FIG. 1) solves the simultaneous equations (5-1) and (5-2) to calculate the parameter $\alpha$ (coefficient) by which inspection reference pattern image data of each of coordinates in the simultaneous equations is multiplied. That is, the coefficient computing unit 214 calculates parameters $b_{00}$ to $b_{44}$ (coefficients).

In the correction pattern image computing step S20, the correction pattern image computing unit 210 (FIG. 1) performs computation to generate data $v'_{i,j}$ of a correction pattern image of the coordinates $(i, j)$ by using the obtained correction model parameters (coefficients) $b_{00}$ to $b_{44}$ as shown by the following equation. The correction pattern image computing unit 210 outputs a correction pattern image v' to the comparator 146 as a result of the computation. $v_{i,j}$ denotes data of an inspection reference pattern image prior to synthesis of the assist pattern image.

$$v'_{i,j} = \sum_{r=0}^{4} \sum_{s=0}^{4} b_{r,s} v_{i+r-2, j+s-2}$$

In such a manner, the correction pattern image computing unit 210 generates a correction pattern image obtained by correcting the inspection reference pattern image by using the coefficients (parameters) $\alpha$ obtained by the coefficient (parameter) computing unit.

In the comparing step S22, the comparator 146 (FIG. 1) compares the correction pattern image v' and the pattern image z to be inspected prior to synthesis of the assist pattern image with each other by using a predetermined algorithm. The comparator 146 determines whether there is a defect or not and outputs the result.

As described above, the correction pattern image v' generated in the above-described step corresponds to an image obtained by shifting the inspection reference image v in accordance with the pattern image z to be inspected while suppressing excessive correction. By comparing the correction pattern image v' obtained here with the pattern image z to be inspected, high-precision inspection can be performed.

Second Embodiment

In the first embodiment, only one kind of an assist pattern image is prepared. However, the invention is not limited to the embodiment. In a second embodiment of the present invention, a configuration of determining pattern density of an image to be inspected and, on the basis of the determination result, selecting a proper assist pattern image from a plurality of assist pattern images prepared will be described. The configuration of the pattern inspection apparatus 100 of the embodiment is similar to that of FIG. 2 except for the internal configuration of the comparison circuit 108. Main steps of a pattern image correcting method in the second embodiment are also similar to those of FIG. 4 except for the assist pattern image selecting step. Therefore, description of the configurations and steps similar to those of the first embodiment will not be repeated.

Figure 7:
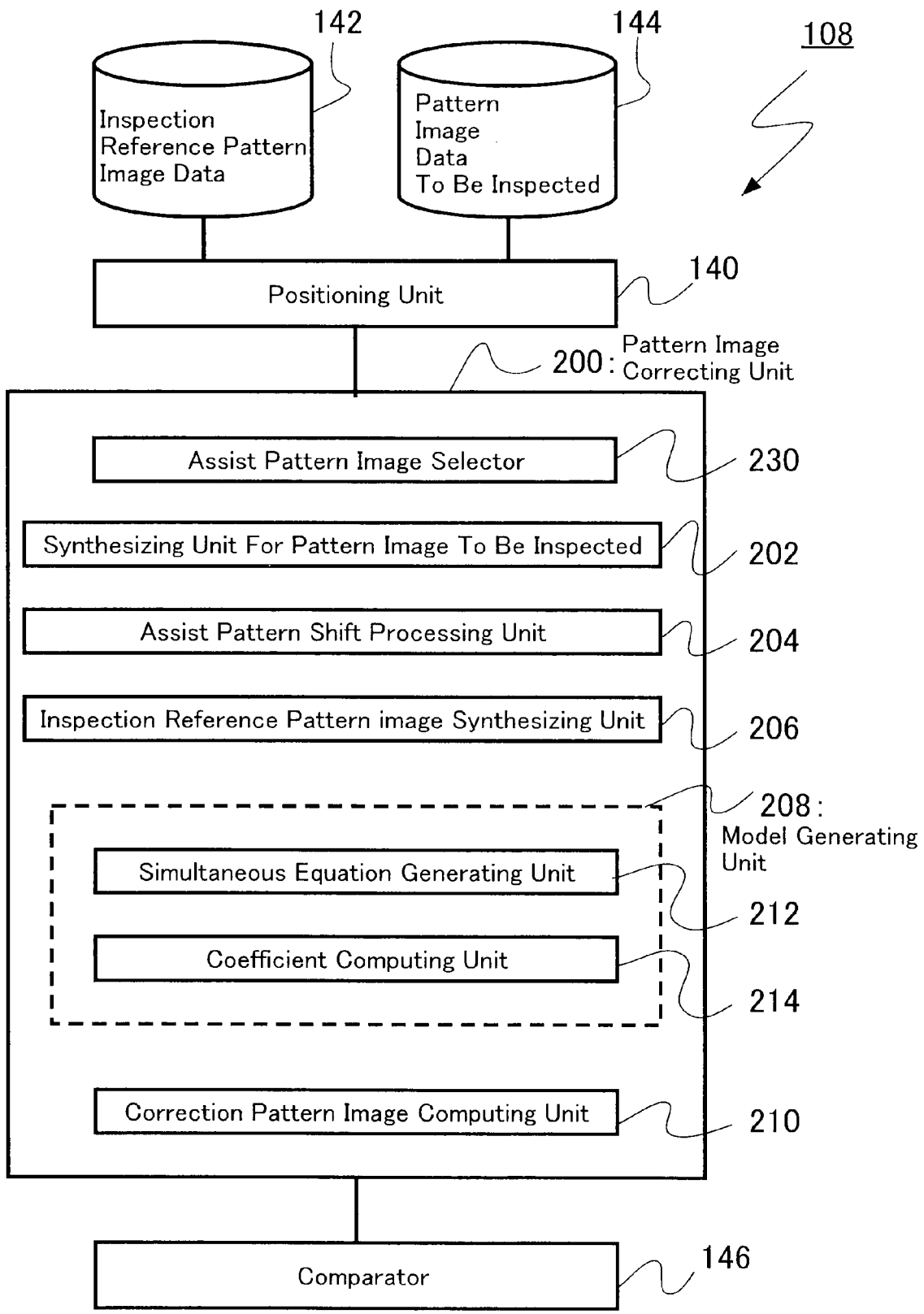
FIG. 7 is a block diagram showing an internal configuration of a comparison circuit of a second embodiment.

FIG. 7 is a block diagram showing the internal configuration of a comparison circuit in the second embodiment. In FIG. 7, the comparison circuit 108 is similar to that of FIG. 1 except that the circuit has an assist pattern image selector 230. The functions of the assist pattern image selector 230, synthesizing unit 202 for a pattern image to be inspected, assist pattern shift processing unit 204, inspection reference pattern image synthesizing unit 206, model generating unit 208, simultaneous equation generating unit 212, coefficient (parameter) computing unit 214, and correction pattern image data computing unit 210 may be respectively realized by, for example, software which can be executed by a computing unit, hardware using electric circuits, combination of software and hardware using electric circuits, or combination of the hardware and firmware.

Figure 8:
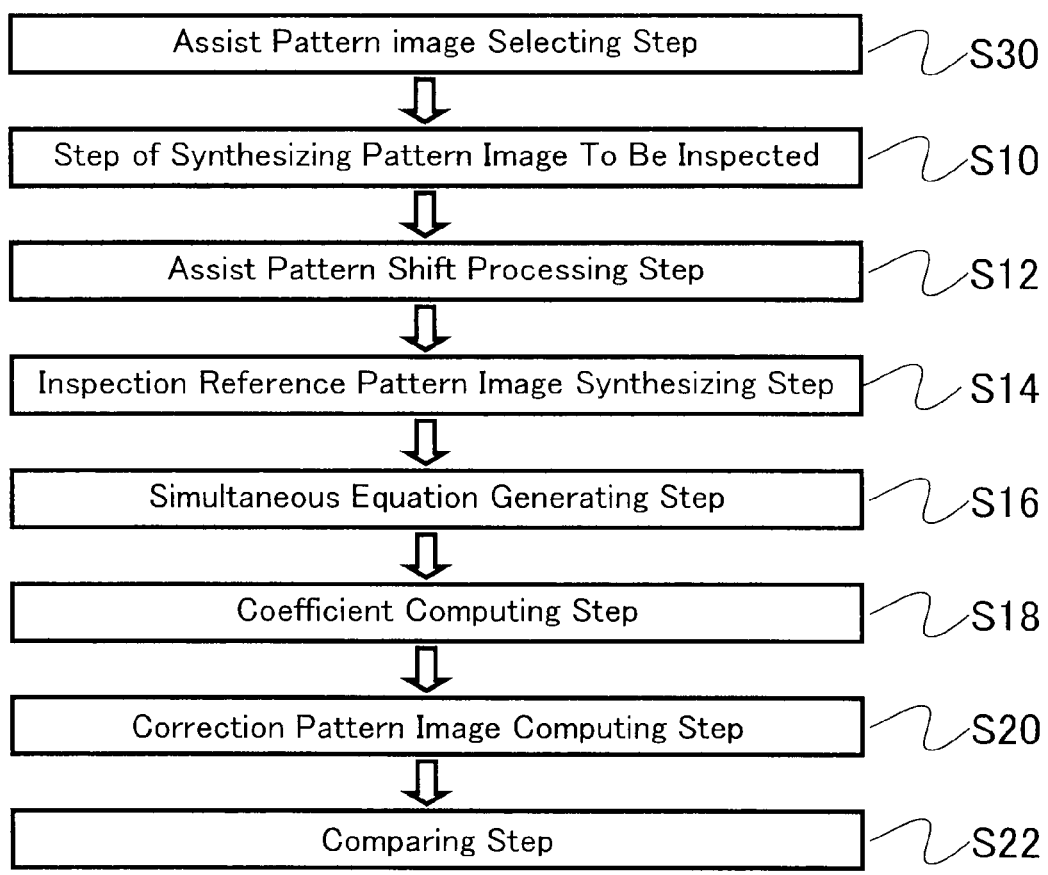
FIG. 8 is a flowchart showing a main process in a pattern image correcting method in the second embodiment.

FIG. 8 is a flowchart showing main steps of the pattern image correcting method in the embodiment. In FIG. 8, the pattern image correcting method includes a series of steps; assist pattern image selecting step S30, inspected pattern image synthesizing step S10, assist pattern shift processing step S12, inspection reference pattern image synthesizing step S14, simultaneous equation generating step S16, coefficient (correction model parameter) computing step S18, and correction pattern image computing step S20. An inspecting method includes a comparing step S22 of comparing a correction pattern image with a pattern image to be inspected.

The assist pattern selector 230 (FIG. 7) evaluates pattern density of a pattern image to be inspected and selects a proper assist pattern image in accordance with the result. Desired kinds of assist pattern images are prepared in advance. For evaluation of pattern density, for example, there is a method of counting the number of pixels of halftone in a predetermined range in an entire image. Since the brightness changes from a light part to a dark part at the boundary of patterns, the pixel value has an intermediate value between the light and dark parts. Therefore, the number of pixels of halftone is almost proportional to length of the pattern boundary. As the pattern density becomes lower, the number of pixels of halftone decreases. As the pattern density becomes higher, the number of pixels of halftone increases. The pattern density evaluation and the selection of the assist pattern image may be performed on the entire image or on each of proper regions obtained by dividing the image.

Figure 9A:
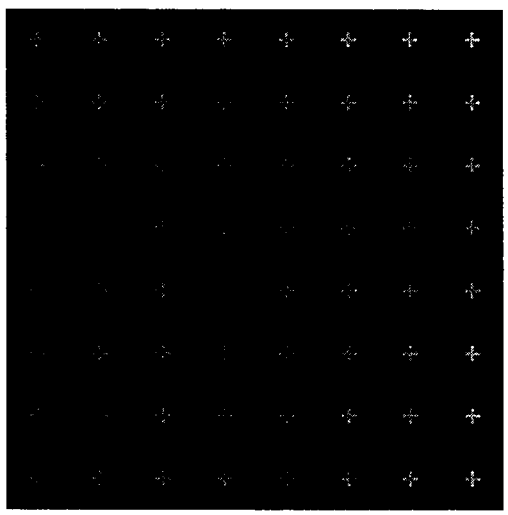
FIG. 9 is a diagram showing an example of an assist pattern image in the second embodiment.
Figure 9B:
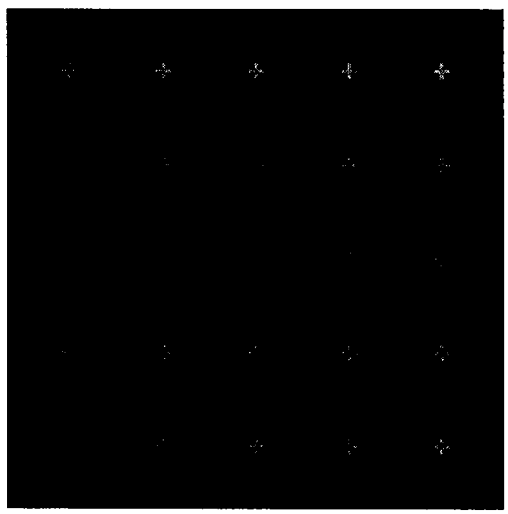
Figure 9C:
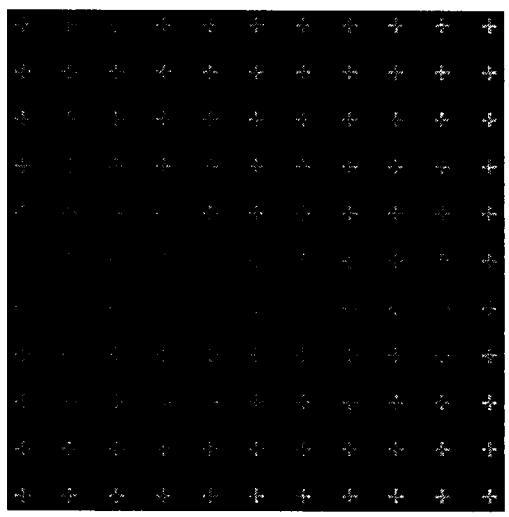

FIGS. 9A, 9B, and 9C show examples of assist pattern images prepared. Three kinds of images of different pattern densities are prepared. In a method of selecting an assist pattern, for example, when the pattern density of pattern images to be inspected is low, an assist pattern image having low pattern density is selected. When the pattern density of pattern images to be inspected is high, an assist pattern image having high pattern density is selected. Consequently, the pattern density of the pattern image to be inspected and that of the assist pattern image are balanced, and a correction model parameter can be properly estimated.

Figure 10:
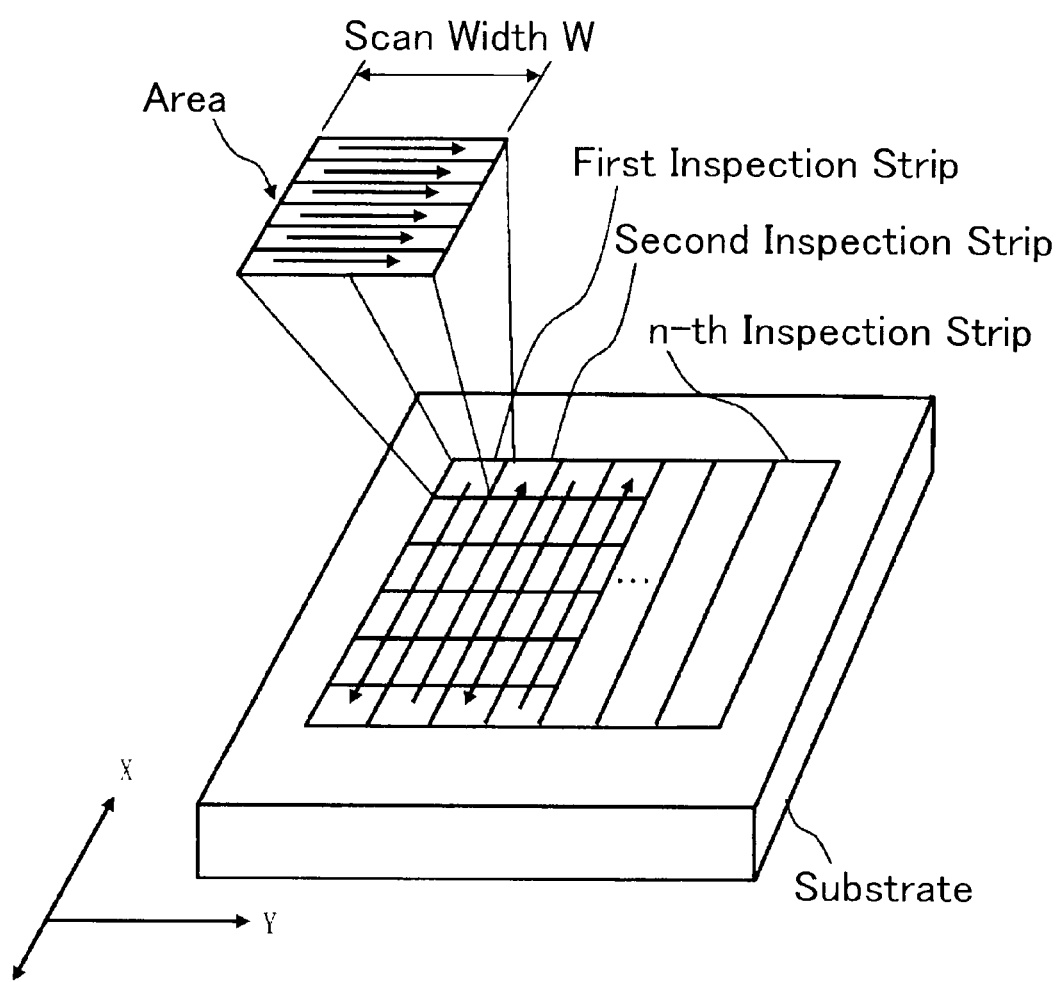
FIG. 10 is a diagram for explaining a procedure of obtaining another optical image.

FIG. 10 is a diagram for explaining another procedure for obtaining an optical image. In the configuration of FIG. 2, the photodiode array 105 having the number of pixels equal to the scan width W (for example, 2,048 pixels) is used. The invention is not limited to the configuration. It is also possible to use a procedure of, as shown in FIG. 10, performing as can with a laser beam in the Y direction emitted from a not-shown laser scan optical apparatus each time movement of a predetermined pitch is detected by a laser interferometer while feeding the XYθ table 102 at constant speed, detecting transmission light, and obtaining a two-dimensional image in each area having a predetermined size.

In the above description, the "circuits" and "steps" can be realized by a program which can operate on a computer, or not only by a program as software but a combination of hardware and software, or a combination of firmware and software. In the case where the circuits and steps are realized by a program, the program is recorded on a recording medium such as a magnetic disk drive, a magnetic tape device, an FD, or a ROM (Read Only Memory). For example, the table control circuit 114, the expansion circuit 111, the reference circuit 112, the comparison circuit 108, and the like constituting an arithmetic controller may be realized by electric circuits, software which can be processed by the control computing unit 110, or a combination of the electric circuits and the software.

The embodiments have been described above while referring to the concrete examples. The present invention, however, is not limited to the concrete examples. For example, transmission light is used in the embodiments. Alternatively, reflection light may be used or transmission light and reflection light may be simultaneously used. Although a reference image as the inspection reference pattern image is generated from design data, data of the same pattern picked up by a sensor such as a photodiode array maybe used. In other words, any of the die to die inspection and the die to database inspection may be employed. Although cubic interpolation is used in the parameter estimating step, another algorithm such as linear interpolation may be used. For example, in the case of linear interpolation, an image u" shifted by using the shift amount "l" in the x direction and the shift amount "m" in the y direction on a predetermined sub-pixel unit basis can be obtained by equations (1-1) and (1-2). In this case, it is sufficient to set as $p_0=p_1=p_4=0$, $p_2=(1-1)$, $p_3=l$, $q_0=q_1=q_4=0$, $q_2=(1-m)$, and $q_3=m$.

Although parts which are not directly necessary for the description of the present invention such as the apparatus configurations, control methods, and the like are not described, necessary apparatus configurations and control methods may be properly selected for use. All of the pattern image correcting apparatus, the pattern inspection apparatus, and the pattern image correcting method having the elements of the present invention and whose design can be properly changed by a person skilled in the art are included in the scope of the present invention.

What is claimed is:

1. A pattern image correcting apparatus for correcting an inspection reference pattern image in a pattern inspection, comprising:
   a first pattern synthesizing unit for synthesizing an assist pattern image and a pattern image to be inspected, thereby generating a pattern image to be inspected with an assist pattern;
   an assist pattern shift processing unit for shifting the assist pattern image on the basis of an amount of a relative positional deviation between the inspection reference pattern image and the pattern image to be inspected;
   a second pattern synthesizing unit for synthesizing the shifted assist pattern image and the inspection reference pattern image, thereby generating an inspection reference pattern image with an assist pattern;
   a model generating unit for generating a position shift model by using the pattern image to be inspected with the assist pattern and the inspection reference pattern image with the assist pattern; and
   a correction pattern image computing unit for correcting the inspection reference pattern image on the basis of the position shift model.

2. The apparatus according to claim 1, wherein the model generating unit comprises:
   a simultaneous equation generating unit for generating simultaneous equations based on a prediction model by using the pattern image to be inspected with the assist pattern and the inspection reference pattern image with the assist pattern; and a coefficient computing unit for computing a coefficient by which data of the inspection reference pattern image is multiplied by solving the simultaneous equations, and the correction pattern image computing unit corrects the inspection reference pattern image by using the coefficient.

3. The apparatus according to claim 1, wherein at least one assist pattern image is selected from a plurality of assist pattern images prepared in advance on the basis of the pattern image to be inspected.

4. The apparatus according to claim 2, wherein at least one assist pattern image is selected from a plurality of assist pattern images prepared in advance on the basis of the pattern image to be inspected.

5. A pattern inspection apparatus, comprising the pattern image correcting apparatus according to claim 1.

6. A pattern inspection apparatus, comprising the pattern image correcting apparatus according to claim 4.

7. A pattern image correcting method of correcting an inspection reference pattern image in a pattern inspection, comprising:

a first pattern synthesizing step of synthesizing an assist pattern image and a pattern image to be inspected, thereby generating a pattern image to be inspected with an assist pattern;

an assist pattern shift processing step of shifting the assist pattern image on the basis of an amount of a relative positional deviation between the inspection reference pattern image and the pattern image to be inspected;

a second pattern synthesizing step of synthesizing the shifted assist pattern image and the inspection reference pattern image, thereby generating an inspection reference pattern image with an assist pattern;

a model generating step of generating a position shift model by using the pattern image to be inspected with the assist pattern and the inspection reference pattern image with the assist pattern; and a correction pattern image computing step of correcting the inspection reference pattern image on the basis of the position shift model.

8. The method according to claim 7, wherein the model generating step comprises:

a simultaneous equation generating step of generating simultaneous equations based on a prediction model by using the pattern image to be inspected with the assist pattern and the inspection reference pattern image with the assist pattern; and a coefficient computing step of computing a coefficient by which data of the inspection reference pattern image is multiplied by solving the simultaneous equations, and in the correction pattern image computing step, the inspection reference pattern image is corrected by using the coefficient.

9. The method according to claim 7, further comprising a step of selecting at least one assist pattern image from a plurality of assist pattern images prepared in advance on the basis of the pattern image to be inspected.

10. The method according to claim 8, further comprising a step of selecting at least one assist pattern image from a plurality of assist pattern images prepared in advance on the basis of the pattern image to be inspected.

* * * * *